United States Patent
Choi

(10) Patent No.: US 7,011,912 B2
(45) Date of Patent: Mar. 14, 2006

(54) METHOD OF DESIGNING AND MANUFACTURING RETICLES FOR USE IN A PHOTOLITHOGRAPHIC PROCESS

(75) Inventor: Won-Woong Choi, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 180 days.

(21) Appl. No.: 10/695,743

(22) Filed: Oct. 30, 2003

(65) Prior Publication Data

US 2004/0091795 A1    May 13, 2004

(30) Foreign Application Priority Data

Nov. 5, 2002 (KR) .................... 10-2002-0068077

(51) Int. Cl.
*G01F 9/00* (2006.01)
(52) U.S. Cl. ..................................... 430/5
(58) Field of Classification Search .............. 430/5, 430/22, 30; 403/30; 356/399, 401; 250/491.1
See application file for complete search history.

(56) References Cited

U.S. PATENT DOCUMENTS

| | | | |
|---|---|---|---|
| 5,450,332 A | 9/1995 | Criscuoli et al. | |
| 5,958,635 A | 9/1999 | Reich et al. | |
| 6,400,839 B1 * | 6/2002 | Takayama | 382/145 |
| 6,455,211 B1 * | 9/2002 | Yui et al. | 430/22 |

* cited by examiner

*Primary Examiner*—S. Rosasco
(74) *Attorney, Agent, or Firm*—Volentine Francos & Whitt, PLLC

(57) ABSTRACT

A method of manufacturing the reticles for manufacturing a semiconductor product using a photolithographic process is relatively error free and can be carried out time in a short amount of time. The method includes creating a first database, in which data of coordinates, regions and process execution conditions for a plurality of pattern images to be transcribed onto various types of semiconductor products, is classified into respective product groups each containing similar ones of the products, creating a second database of process marks and scribe lane regions corresponding to each of the classified product groups; extracting from the second database data for the process mark and scribe lane region of a reticles for manufacturing the product; determining reference coordinates for the process mark based on reference coordinates of the plurality of pattern images and the selected scribe lane region; and designing and forming a reticle through batch-process between the coordinates of the process mark and the reference coordinates of the pattern images.

6 Claims, 5 Drawing Sheets

Coordinates A; (a, b)
Coordinates B; (c, d)
Coordinates C; (e, f)

Process Mark

METHOD OF DESIGNING AND MANUFACTURING RETICLES FOR USE IN A PHOTOLITHOGRAPHIC PROCESS

BACKGROUND OF THE INVENTION

1. Field of the Invention

The present invention relates to the photolithographic process used for manufacturing semiconductor devices. More specifically, the present invention relates to a method of manufacturing the reticles used in the photolithographic process for transcribing images onto layers stacked on a substrate.

2. Description of the Related Art

Photolithography is a process generally used to sequentially and selectively transcribe different pattern images, provided by a plurality of reticles, respectively, onto a wafer. More specifically, a photoresist on the wafer is exposed to light directed through the reticle, whereby the pattern image of the reticle is transferred to the photoresist. The photoresist is then developed so as to produce a pattern corresponding to the pattern image of the reticle. Subsequent processes, such as the etching of layers on the wafer and the deposition of conductive material on the wafer, are carried out using the patterned photoresist as a mask. The pattern image of a reticle thus provides the standard by which the subsequent processing of the wafer is carried out. The result of these processes is the forming of several conductive patterns throughout a plurality of layers on the wafer, which patterns are connected to collectively form a circuit pattern.

To produce a fine circuit it is thus important to manage the photolithographic process so that each pattern image is accurately aligned over the different patterns formed on the underlying layers. More specifically, a critical aspect of the photolithographic process is overlay management—the exact overlaying of a pattern image on a pre-existing patterned layer. Such an overlay is performed using alignment marks that are formed on the wafer and the reticle that is being used to expose the wafer.

Nowadays, many current attempts are being made to produce circuits having higher and higher and more accurate pattern densities through the designing of the pattern images of the reticles and/or the composition of the photoresist. A pattern image is formed, i.e., a reticle is typically produced, by laying out circuit pattern data on a quartz plate using a design instrument such as CAD (Computer Aided Design), by coating the quartz plate with a film of material such as chromium (Cr), and etching the film to form a pattern corresponding to the circuit pattern data. The circuit pattern data is generally classified into main chip circuit data 12 and reticle frame data 14, as shown in FIG. 1.

The main chip circuit data 12 is representative of the configuration of the image pattern to be formed at the central (image pattern) region of the reticle, and includes coordinate data 16. The coordinate data 16 represents the coordinates of the layout of the pattern image of the reticle 10.

The reticle frame data 14 is generated on the basis of the coordinate data 16. The reticle frame data 14 includes data representing the layout of alignment marks 20 that are to be provided in a scribe lane 18 of the reticle 10. Thus, the reticle frame data 14 represents the shape and size of the alignment marks 20 appropriate for the scribe lane 18. In this application, the term "alignment marks" is used to generically refer to all of the marks that may be found on the reticle 10, apart from the pattern image itself.

A conventional method of generating reticle frame data 14 will now be described with reference to FIG. 2. First, the pattern images are designed (ST102), namely all of the images to be transcribed onto the various layers on a wafer in manufacturing a particular product. The alignment marks are then selected (ST104). This step (ST104) comprises selecting appropriate alignments mark for each pattern image, and includes establishing the size and shape and reference coordinates of each alignment mark. The alignment marks also include data for correlating the reticle with the product that the reticle will be used to manufacture (e.g., an SRAM or a DRAM), and/or the layer of the product that the reticle will be used to expose. Such data may be realized as a bar code in the margin of the reticle 10.

Next, select ones of the alignment marks are discriminated as a "process mark" (ST106). The process mark comprises those alignment marks 20 that will be located in the scribe lane 18 of the reticle.

Once the process mark is established, the dimensions of the scribe lane region 18 are established based on the layout of the process mark and on the size of the pattern image (ST108).

The process marks for the respective pattern images are then laid out in the scribe lanes 18, for example (ST110). As shown in FIG. 3, this step of laying out a process mark is executed by confirming the location of the mark one by one against a plurality of marks (represented by Cells A, B and C in the figure), and by forming the process mark at that location using layout editing software (ST112). In this process, the reference coordinates are input to the software by a software technician.

However, there may be hundreds or thousands of reference coordinates of the pattern images. Thus, inputting the reference coordinates of a pattern image one by one to lay out the process marks in the scribe lanes 18 of the reticles requires a great amount of time.

Furthermore, the process mark on the reticle frame of each reticle is manufactured manually by a technician using layout editing software. Not only is this process time-consuming, but the accuracy and a reliability of this process is prone to errors made by the technician. Thus, even more time is spent re-checking the procedure and correcting it when necessary.

SUMMARY OF THE INVENTION

Therefore, it is one object of the present invention to provide a method of manufacturing a reticle in which the reticle frame data (data that will set up the alignment marks in the scribe lane and margin of the reticle, especially the process mark) can be generated automatically from a database.

In general, according to one aspect of the present invention, a method of manufacturing a reticle for use in a photolithography process allows the process mark of the reticle to be readily selected by: creating data of coordinates and regions, and process execution conditions, for a plurality of image patterns associated with each of several different possible products to be manufactured; configuring alignment marks for each product; and extracting, from the data, reference coordinates dictated by the plurality of pattern images for any one product; and by batch-processing the reference coordinates.

More specifically, according to one aspect of the present invention, a method of designing and manufacturing a reticle for use in a photolithography process comprises: creating a first database, in which data having coordinates, regions and process execution conditions for a plurality of pattern images to be transcribed onto each of a plurality of semiconductor products, is classified into respective groups of similar products; creating a second database of process mark selection and scribe lane region ranges (boundaries) corresponding to each of the classified product groups; using the database in a program, to extract the process mark selection and scribe lane region ranges of a corresponding product group from reference coordinates of the plurality of pattern images designed for a corresponding product; selecting at least one set of the reference coordinates so obtained by combining the reference coordinates of the plurality of pattern images associated with the corresponding product with each scribe lane region range; and designing and forming a reticle by batch-processing of the coordinates between the process mark selected through the reference coordinates and the pattern images.

The reference coordinates can be formed by hypothetically selecting a center from the respective coordinates of the scribe lane region involving a regional position of the plurality of pattern images. The reference coordinates can be formed by further forming a reference mark at one side provided from coordinates of the scribe lane region involving the regional position of the plurality of pattern images, the reference mark being for designating other reference coordinates.

The step of designing and forming the process mark through use of coordinates of the process mark includes batch applying coordinates formed through at least two or more determined reference coordinates to each pattern image.

As described above, according to the prior art, the method of generating reticle frame data generally comprises steps of: drawing various marks, forming a scribe lane, and extracting information about the alignment marks on the reticle frame. The various kinds of marks necessary for forming the reticle frame (scribe lane and margin) were formed manually on each reticle using layout editing software. Such manual work was time-consuming and prone to large amounts of human error.

On the other hand, the present invention provides a method by which the reticle frame data is automatically generated using a program and data (database). This aspect of the invention is achieved by labeling the process marks with reference coordinates so that the labeled process marks can be read.

BRIEF DESCRIPTION OF THE DRAWINGS

The present invention will become more fully understood from the detailed description thereof that follows with reference to the accompanying drawings, of which.

DETAILED DESCRIPTION OF THE PREFERRED EMBODIMENTS

Figure 1:
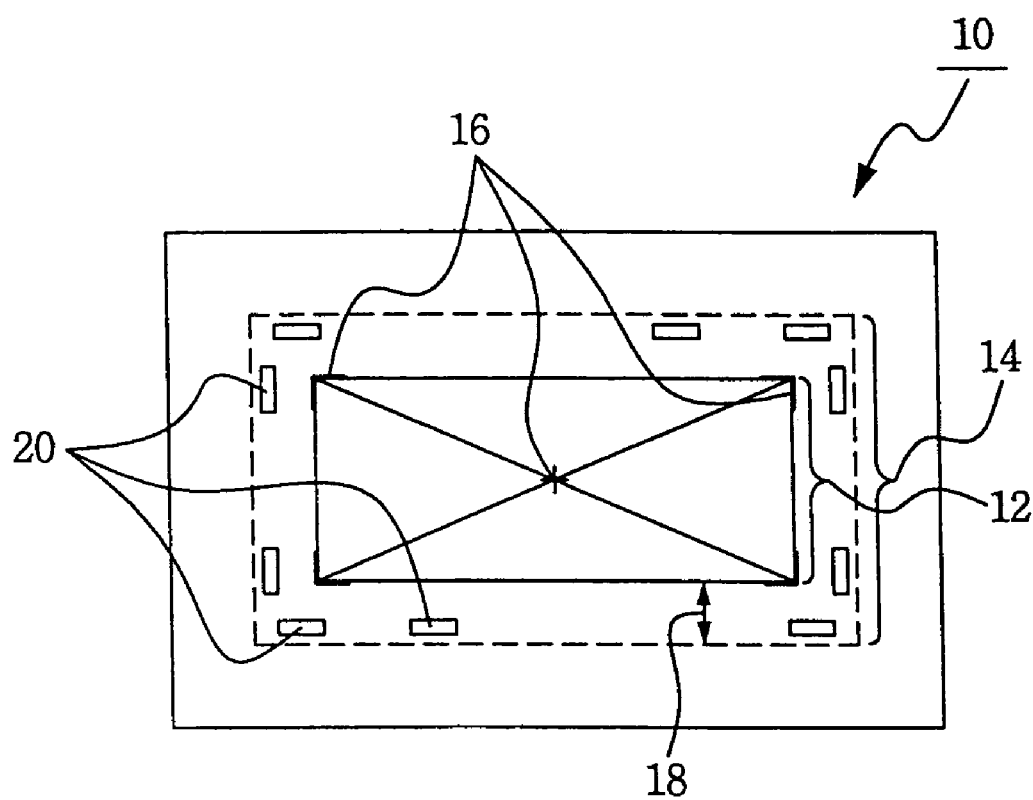
FIG. 1 is a schematic plan view of a conventional reticle.
Figure 2:
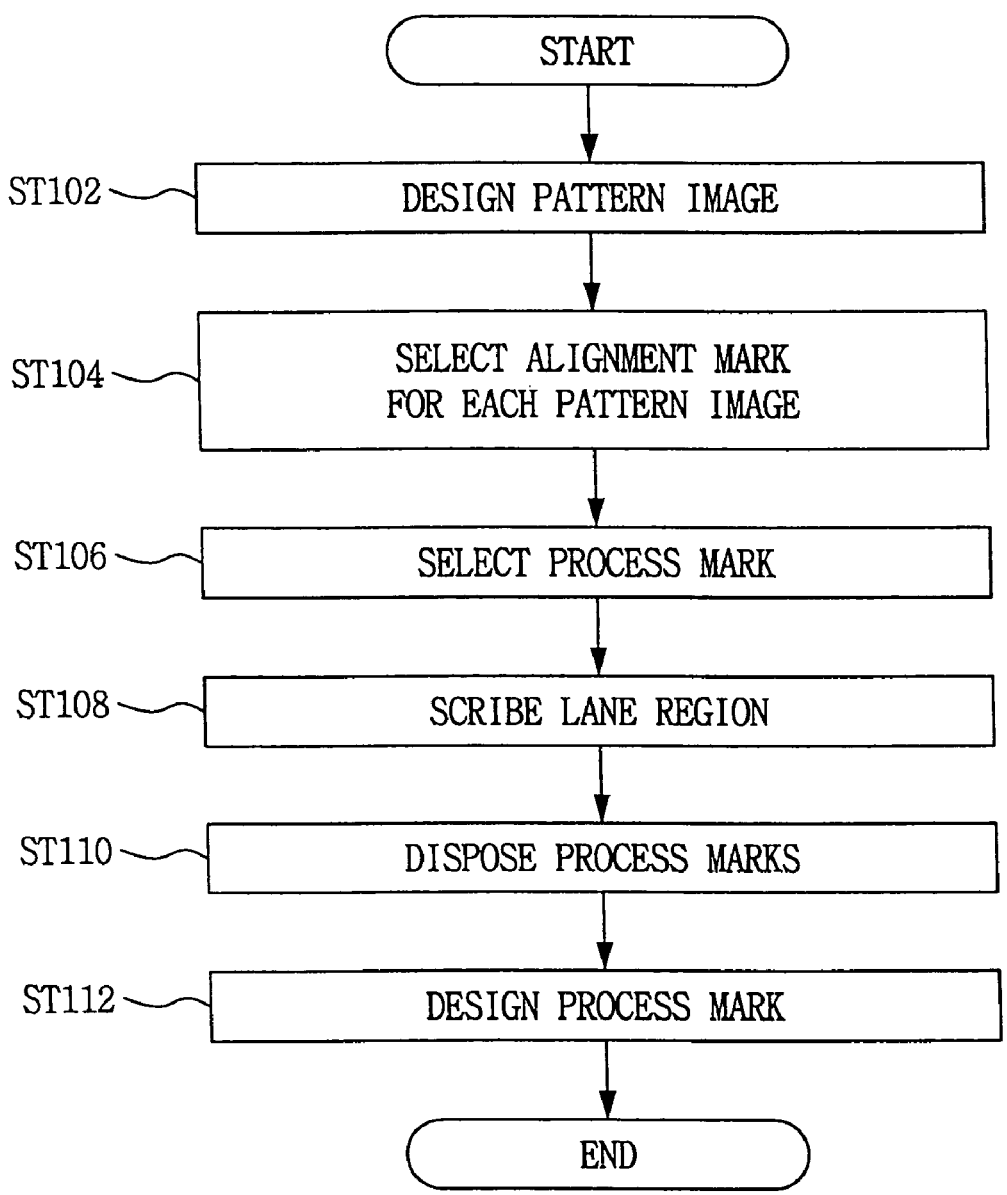
FIG. 2 is a flowchart of a conventional technique for use in the manufacturing of a reticle.
Figure 3:
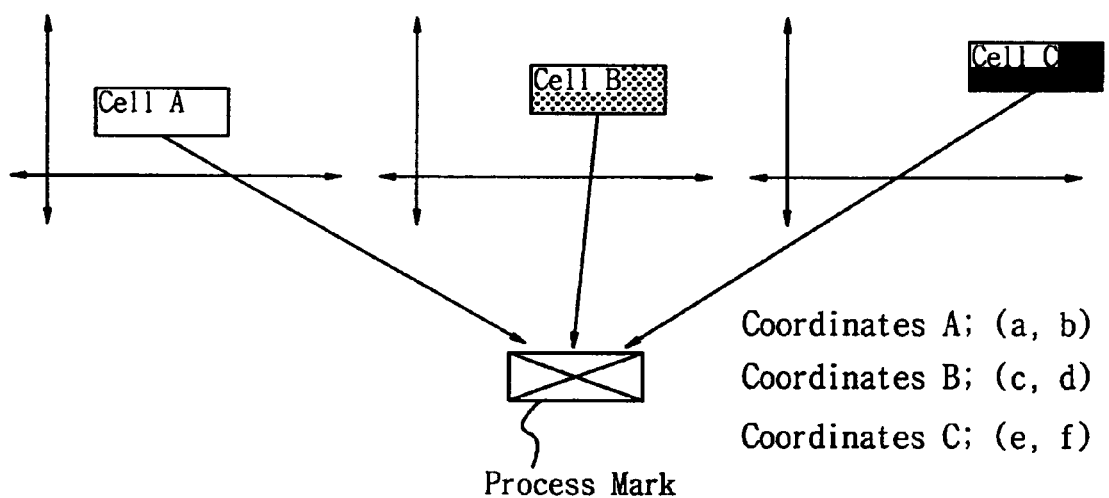
FIG. 3 illustrates a step in the designing of a process mark in the method illustrated in FIG. 2.
Figure 4:
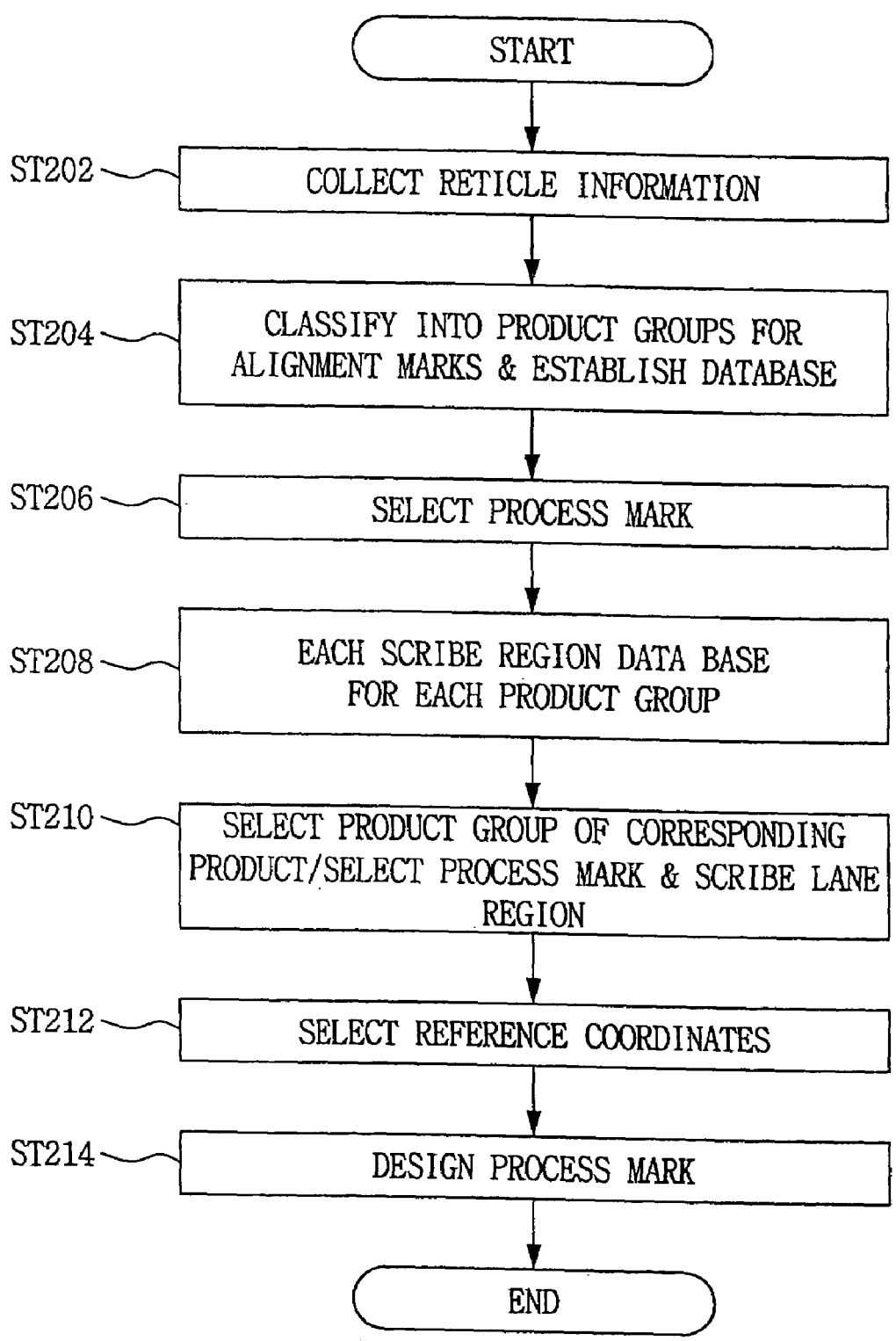
FIG. 4 is a flowchart of a technique for use in the manufacturing of a reticle according to the present invention.

A method for use in the manufacturing of a reticle will now be described with reference to FIGS. 4 and 5.

In the manufacturing of semiconductor products using photolithography, various data pertaining to each reticle is gathered from those products that have already been manufactured or from the process being used to manufacture new products (ST202). Such data gathered for each reticle can be divided into main chip circuit data 12 and reticle frame data 14.

The main chip circuit data 12 provides several reference coordinates by which the pattern image of the reticle (as well as certain alignment marks) may precisely laid out on the pattern image region of the reticle. The reticle frame data 14, on the other hand, includes data representative of the alignment marks 20 that are formed in the frame of the reticle, namely in the scribe lane 18 and the margin of the reticle located outwardly of the scribe lane 18. These alignment marks 20 include information about the shape and size of the pattern image.

Numerous products are classified into a plurality of product groups to establish a database. The data of this database is divided on the basis of alignment mark data (ST204). The alignment data, in this case, refers to data representing the alignment marks formed on the reticle.

In the present invention, these alignment marks refer to the ones that are formed on the frames of the reticles, namely, the process marks. Each process mark is matched with the appropriate product group (ST 206). The bounds of the scribe lane 18 are precisely determined using the data representative of the process mark, and data representing the bounds of the scribe lane is stored in the database (ST208).

The product to be manufactured (semiconductor device) is assigned to its corresponding product group by substituting coordinates of the patterns of the product into the established database. Then the process mark corresponding to the product group is selected, and designated as a standard mark for that product. Accordingly, the bounds of the scribe lane for the reticles required to manufacture the product is readily obtained from the standard mark (ST210).

Also, the standard marks are completed through at least the following processes. The standard marks on the reticles are corrected so that the final standard marks may conform to the corresponding process marks that are necessary to fabricate the semiconductor device.

The standard marks are provided (assigned) at least one more set of reference coordinates. Each set of reference coordinates corresponding to each of the standard marks is determined in consideration of the combination of factors necessary for forming each of the pattern images and the bounds of the corresponding scribe lanes (ST212).

Figure 5:
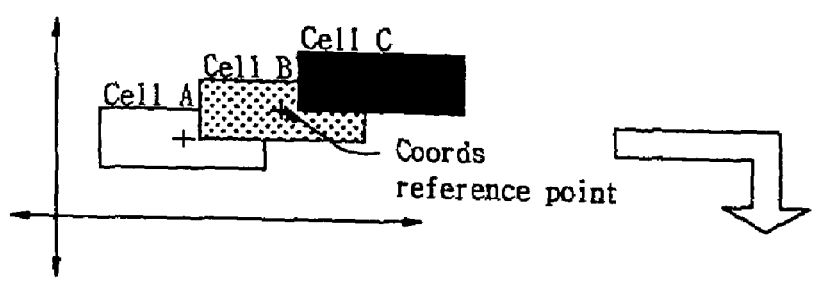
FIG. 5 illustrates a step in the designing of a process mark in the method illustrated in FIG. 4.

Next, as shown in FIG. 5, all of the process marks that are corrected and selected according to the products, or layers, or pattern images are tabled (library) so that a program can read this library at any time. Accordingly, the reticles can be made automatically from the program without the need to draw the process marks on the reticles for each change in layer or product (ST214).

Herewith, the reference coordinates can be formed by hypothetically selecting a center from respective coordinates in the scribe lane region for the corresponding product, or by further forming a reference mark indicating other reference coordinates at one side from the respective coordinates of the scribe lane region.

The step of designing and forming the reticle through use of coordinates of the process mark includes batch applying coordinates formed through at least two or more determined reference coordinates for each pattern image.

The coordinates of such process mark can be designed by batch-processing at least two determined reference coordinates for each of the pattern images, or by obtaining coordinates of the process mark combined through a one by one corresponding between the plural reference coordinates and respective coordinates of the plural pattern image regions and by batch-processing the coordinates for each pattern image.

According to the present invention, the process mark can be easily selected from a configuration of the alignment marks matched with each product, by establishing a database of coordinates and regions and process execution conditions, the coordinates and regions being those related to the patterns of one product, by extracting from the database the reference coordinates of the plurality of patterns of any one product, and by batch-processing the coordinates of the process mark. Accordingly, the time required to select and manufacture the process mark can be shortened, and a reliability of the manufacture is improved.

Finally, although the present invention has been described above in connection with certain preferred embodiments thereof, various changes to and modification of these embodiments will become readily apparent to those of ordinary skill in the art. Accordingly, all such changes and modifications are seen to be within the true spirit and scope of the invention as defined by the appended claims.

What is claimed is:

1. A method of manufacturing a reticle for use in photolithography, comprising:

creating a first database of data representing coordinates, regions and process execution conditions for a plurality of pattern images to be transcribed onto different types of semiconductor products using a plurality of reticles in a photolithographic process, and classifying the data of said first database according to groups of similar types of the products;

creating a second database of data, representing process marks and boundaries of scribe lanes of the reticles, corresponding to each of the product groups;

for a selected product, inputting reference coordinates of the plurality of image patterns to be transcribed onto the selected product to extract from the second database the process marks and the scribe lane boundaries of reticles to be used for transcribing the image patterns onto the selected product;

determining at least one set of reference coordinates correlating each of the plurality of image patterns of the selected product with the corresponding scribe lane region boundaries extracted from the second database; and designing and forming a reticle by batch-processing of the coordinates of the process mark.

2. The method of claim 1, wherein said determining of the reference coordinates comprises hypothetically selecting a center from the respective coordinates of the scribe lane region based on relative positions of the plurality of pattern images.

3. The method of claim 1, wherein said determining of the reference coordinates further comprises selecting a reference point at one side provided from coordinates of the scribe lane region involving the regional position of the plurality of pattern images, the reference mark being for designating other reference coordinates.

4. The method of claim 1, wherein said designing and forming the reticle through the coordinates of the process mark includes batch applying each of coordinates formed through at least two or more determined reference coordinates to each of the pattern images.

5. The method of claim 1, wherein said designing and forming the reticle through the coordinates of the process mark includes one to one correspondence between the plurality of reference coordinates and coordinates provided in a region of the plurality pattern images to obtain the coordinates of the process mark, and a batch-processing of the coordinates to the respective pattern images.

6. A method of manufacturing reticles for use in manufacturing a semiconductor product using a photolithographic process, comprising:

creating a database including main chip circuit data associated with a pattern images to be formed at central regions of reticles, scribe lane region data representing the form of a scribe lanes that are to surround the pattern images, respectively, and process marks that are to be formed in frames of the reticles located around the central regions of the reticles;

classifying the pattern image region data according to product groups, each of the product groups containing similar products that can be made using the photolithographic process;

labeling the process marks with reference coordinates;

for a specific one of the products to be manufactured, selecting process marks and the region of scribe lanes of the reticles to be used in manufacturing the products from the database on the basis of pattern image region data specific to the product;

automatically producing a layout of the selected process marks on the frames of the reticles, on the basis of combinations of the pattern image region data specific to the product and the selected scribe lanes; and automatically drawing the process marks on the selected scribe lane regions of the reticles, respectively, using said layout.

* * * * *